(12) United States Patent
Nishi et al.

(10) Patent No.: US 8,426,740 B2
(45) Date of Patent: Apr. 23, 2013

(54) METAL BASE CIRCUIT BOARD

(75) Inventors: Taiki Nishi, Shibukawa (JP); Takeshi Miyakawa, Shibukawa (JP); Kiyokazu Yamazaki, Shibukawa (JP); Takashi Saiki, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 279 days.

(21) Appl. No.: 12/994,507

(22) PCT Filed: May 21, 2009

(86) PCT No.: PCT/JP2009/059363
§ 371 (c)(1),
(2), (4) Date: Feb. 3, 2011

(87) PCT Pub. No.: WO2009/145109
PCT Pub. Date: Dec. 3, 2009

(65) Prior Publication Data
US 2011/0132644 A1 Jun. 9, 2011

(30) Foreign Application Priority Data
May 29, 2008 (JP) ................. 2008-140303

(51) Int. Cl.
*H05K 1/03* (2006.01)

(52) U.S. Cl.
USPC ........... 174/255; 174/250; 174/256; 174/258; 174/260; 174/262; 174/527; 174/546; 428/209; 428/210; 428/325; 428/626; 257/678; 257/693; 257/737; 257/782; 29/825; 29/830; 29/852

(58) Field of Classification Search ............... 174/255, 174/250, 256, 258, 260, 262, 527, 546; 428/209, 428/210, 325, 626; 257/678, 693, 737, 782; 29/825, 830, 852
See application file for complete search history.

(56) References Cited

U.S. PATENT DOCUMENTS

| 4,737,672 A | 4/1988 | Kazami |
| 6,413,620 B1 * | 7/2002 | Kimura et al. ................. 428/210 |

(Continued)

FOREIGN PATENT DOCUMENTS

| EP | 1 887 031 A1 | 2/2008 |
| EP | 1 909 324 A1 | 4/2008 |

(Continued)

OTHER PUBLICATIONS

International Search Report issued in PCT/JP2009/059363 on Jul. 7, 2009.

(Continued)

*Primary Examiner* — Xiaoliang Chen
(74) *Attorney, Agent, or Firm* — Stein IP, LLC

(57) ABSTRACT

A metal base circuit board, having an insulating layer with a linear expansion coefficient of 60 ppm per degree C. or higher and 120 ppm per degree C. or lower, a metal foil provided on one side of the insulating layer, comprising a metal material with a linear expansion coefficient of 10 ppm per degree C. or higher and 35 ppm per degree C. or lower, a circuit portion and a non-circuit potion having a linear expansion coefficient of 10 ppm per degree C. or higher and 35 ppm per degree C. or lower, and a white film formed on top of the insulating layer, circuit portion, and non-circuit portion, the total sum of the areas of the non-circuit portion and the circuit portion on top of the insulating layer being 50% or higher and 95% or lower relative to the area of the metal foil and the relation between the linear expansion coefficients of each of the materials being: linear expansion coefficient of insulating layer>linear expansion coefficient of metal foil>linear expansion coefficient of circuit portion and non-circuit portion, such that Lifespan of LEDs can be lengthened, and the workability of the printed circuit board during circuit formation and during LED mounting can be improved.

4 Claims, 1 Drawing Sheet

U.S. PATENT DOCUMENTS

| | | | |
|---|---|---|---|
| 6,548,832 B1 | 4/2003 | Sakamoto et al. | |
| 2003/0136577 A1* | 7/2003 | Abe | 174/255 |
| 2004/0164400 A1* | 8/2004 | Meyer-Berg | 257/693 |
| 2008/0314618 A1* | 12/2008 | Shimoosako et al. | 174/250 |

FOREIGN PATENT DOCUMENTS

| | | |
|---|---|---|
| JP | 62-165393 | 7/1987 |
| JP | 4-170080 | 6/1992 |
| JP | 9-8422 | 1/1997 |
| JP | 2000-353826 | 12/2000 |
| JP | 2002-353388 | 12/2002 |
| JP | 2007-12856 | 1/2007 |
| JP | 2008-47843 | 2/2008 |
| JP | 2008-60372 | 3/2008 |

OTHER PUBLICATIONS

European Search Report issued Oct. 4, 2011, in corresponding European Patent Application No. 09754617.0-2210 / 2293656 PCT/JP2009059363.

* cited by examiner

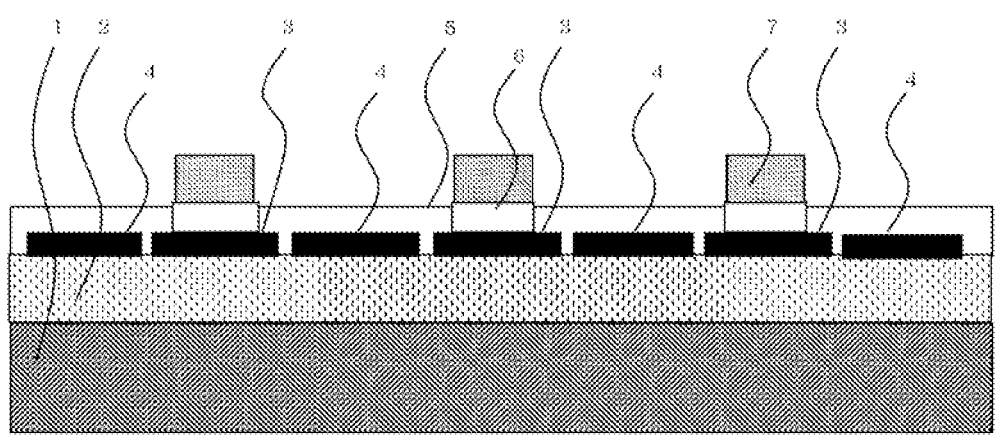

US 8,426,740 B2

METAL BASE CIRCUIT BOARD

CROSS-REFERENCE TO RELATED APPLICATIONS

This application claims the benefit of PCT International Patent Application No. PCT/JP2009/059363, filed May 21, 2009, and Japanese Patent Application No. 2008-140303, filed May 29, 2008, in the Japanese Patent Office, the disclosures of which are incorporated herein by reference.

BACKGROUND OF THE INVENTION

1. Field of the Invention

The present invention concerns a metal base circuit board for use in fields where heat dissipation and thinness are demanded, such as liquid crystal display devices that use LEDs (light emitting diodes) as light sources.

2. Description of the Related Art

Examples of light sources for liquid crystal backlights are CCFLs (Cold Cathode Fluorescent Lamps) and LEDs.

CCFLs have ease of use and long operating lifespan as advantages, whereas LEDs have the advantages of excellent color reproduction, high brightness, and thinness, and since they do not use mercury they have a lower environmental impact in comparison with CCFLs, and they are resistant to vibration and impact, and can be used over a large temperature range (−40 degrees C. to 85 degrees C.), and further, can have an operating lifespan of 50 thousand hours depending upon the operating environment.

Since the luminous efficiency of LEDs is low in comparison with CCFLs, in enclosed spaces such as the interior of liquid crystal backlights, there is a tendency for the temperature in the vicinity of LEDs to be higher in comparison with CCFLs. Under such conditions, the brightness decreases, and because it is then necessary to increase the electric current, the amount of heat generated increases, and the temperature rises further.

Because of this, the deterioration of the semiconductor elements is accelerated due to the temperature rise of the LEDs, and the operating lifespan of the LEDs becomes shorter. Because of this, printed circuit boards on which LEDs are mounted demand good heat dissipation.

As one method for dissipating heat in LED-mounted printed circuit boards, there is a method whereby printed circuit boards release heat to the housing via a heat conducting material (see patent document 1). However, in this method, it is difficult for a printed circuit board alone to dissipate heat to the housing, and accessory members become necessary, so the cost increases, and this is undesirable.

In another heat releasing method, there is a structure wherein heat is released from a heat releasing portion that is also a circuit pattern for a printed circuit board, through thermal vias to a heat releasing pattern on the reverse side, and then to the housing (see patent document 2). However, there is the problem that the constitution of the board is complex.

Patent Document 1: JP-A 2002-353388
Patent Document 2: JP-A 2007-12856

SUMMARY OF THE INVENTION

In the present invention, the problem to be solved is to improve the workability of printed circuit boards during circuit formation and during LED mounting, by having an excellent heat releasing characteristic without the need for accessory members or thermal vias, in circuit boards for LED backlights.

That is, according to the present invention, a metal base circuit board is provided, having an insulating layer with a linear expansion coefficient of 60 ppm per degree C. or higher and 120 ppm per degree C. or lower, a metal foil provided on one side of the insulating layer, comprising a metal material with a linear expansion coefficient of 10 ppm per degree C. or higher and 35 ppm per degree C. or lower, a circuit portion and a non-circuit potion having a linear expansion coefficient of 10 ppm per degree C. or higher and 35 ppm per degree C. or lower, and a white film formed on top of the insulating layer, circuit portion, and non-circuit portion, the total sum of the areas of the non-circuit portion and the circuit portion on top of the insulating layer being 50% or higher and 95% or lower relative to the area of the metal foil, the relation between the linear expansion coefficients of each of the materials being: linear expansion coefficient of insulating layer>linear expansion coefficient of metal foil>linear expansion coefficient of circuit portion and non-circuit portion.

Additionally, in one mode of the present invention, a metal base circuit board is provided wherein said insulating layer is formed with epoxy resin, a curing agent, and an inorganic filler, and the inorganic filler makes up 40 percent by volume or more, and 70 percent by volume or less, of the total volume of the insulating layer.

Additionally, in one mode of the present invention, a metal base circuit board is provided wherein said curing agent contains a substance that has either one or both of a hydroxyl group and an amino group.

Additionally, in one mode of the present invention, a metal base circuit board is provided wherein said white film contains titanium dioxide as a white pigment, the titanium dioxide being rutile type and the surface being coated with aluminum hydroxide or silicon dioxide.

According to the present invention, in a substrate for an LED backlight, the operating lifespan of LEDs can be lengthened because it has an excellent heat releasing characteristic without the need for accessory members or thermal vias, and by suppressing the amount of warping, the workability of the printed circuit board during circuit formation and during LED mounting can be improved.

BRIEF EXPLANATION OF THE DRAWINGS

FIG. 1 Explanatory drawing showing one example of the metal base circuit board according to the present invention schematically (cross-section drawing).

| EXPLANATION OF REFERENCE NUMBERS | |
|---|---|
| 1 | metal foil |
| 2 | insulating layer |
| 3 | circuit portion |
| 4 | non-circuit portion |
| 5 | white film |
| 6 | solder joint portion |
| 7 | LED package |

DETAILED DESCRIPTION OF THE EMBODIMENTS

Herebelow, a metal base circuit board according to one mode of embodiment of the present invention shall be explained using drawings.

FIG. 1 shows schematically a hybrid integrated circuit module using a metal base circuit board according to one mode of embodiment of the present invention, and it shows a cross-sectional drawing of the metal base circuit board.

As shown in FIG. 1, the metal base circuit board according to the present mode of embodiment is equipped with a metal foil 1, an insulating layer 2, a circuit portion 3 formed on the surface of the insulating layer 2 whereon the metal foil 1 is not provided, a non-circuit portion 4 formed on the surface of the insulating layer 2 whereon the metal foil 1 is not provided, and a white film 5 formed on top of the insulating layer 2 and the circuit portion 3 and the non-circuit portion 4.

As shown in FIG. 1, by mounting the LED package 7 on top of the circuit portion 3 via a solder joint portion 6, this becomes a hybrid integrated circuit module.

The metal base circuit board according to the present mode of embodiment has an insulating layer with a linear expansion coefficient of 60 ppm per degree C. or higher and 120 ppm per degree C. or lower, a metal foil provided on one side of the insulating layer, comprising a metal material with a linear expansion coefficient of 10 ppm per degree C. or higher and 35 ppm per degree C. or lower, a circuit portion and a non-circuit potion having a linear expansion coefficient of 10 ppm per degree C. or higher and 35 ppm per degree C. or lower, and a white film formed on top of the insulating layer, circuit portion, and non-circuit portion.

Further, the total sum of the areas of the non-circuit portion and the circuit portion on top of the insulating layer is 50% or higher and 95% or lower relative to the area of the metal foil. Further, it is characterized in that the relation between the linear expansion coefficients of each of the materials is: linear expansion coefficient of insulating layer>(greater than) linear expansion coefficient of metal foil>linear expansion coefficient of circuit portion and non-circuit portion.

[Circuit Portion and Non-Circuit Portion]

In the present invention, the circuit portion and the non-circuit portion comprise the same conducting material (conducting metal) provided on top of the insulating layer, and the circuit portion refers to the circuit portion wherein an electric current flows in order to drive the electronic and electric elements. Additionally, the non-circuit portion according to the present invention refers to conducting material (conducting metal) that is not electrically utilized.

In the metal base circuit board according to the present mode of embodiment, the total sum of the areas of the non-circuit portion 4 and the circuit portion 3 on top of the insulating layer 2 is 50% or higher and 95% or lower.

If said total sum of the area is 50% or higher, then the warping of the metal base circuit board can be suppressed, and the mounting of electronic parts such as LEDs can be done easily. Additionally, if said total sum of the area is 95% or lower, a sufficient space between the circuit portion and the non-circuit portion can be secured, so that electrical reliability can be secured.

In the metal base circuit board according to the present mode of embodiment, the linear expansion coefficient of the circuit portion 3 and the non-circuit portion 4 is 10 ppm per degree C. or higher, and 35 ppm per degree C. or lower.

As conducting materials that may be used as the circuit portion 3 and the non-circuit portion 4, these can be selected appropriately as long as they are conducting materials having said linear expansion coefficients, and concretely, they include Ni, Cu, Al, Fe, Si, stainless steel, or alloys thereof.

Among these, in consideration of heat dissipation, Cu, Al, or alloys of Cu and Al are particularly preferable.

In the metal base circuit board according to the present mode of embodiment, it is preferable for the thickness of the circuit portion 3 and the non-circuit portion 4 to be 18 μm or more, and 70 μm or less.

If the thickness of the circuit portion 3 and the non-circuit portion 4 is 18 μm or less, then problems such as wrinkles can easily arise in handling during the manufacture of the metal base circuit board. Additionally, if the thickness of the circuit portion 3 and the non-circuit portion 4 is 70 μm, then problems arise during pattern production of the circuit portion and the non-circuit portion.

[Metal Foil]

In the metal base circuit board according to the present mode of embodiment, the linear expansion coefficient of the metal material constituting the metal foil 1 is 10 ppm per degree C. or higher and 35 ppm per degree C. or lower.

Metals that can be utilized as metal foils can be selected appropriately as long as they are metals having said linear expansion coefficients, and concretely, they include Ni, Cu, Al, Si, Fe, stainless steel, or alloys thereof.

Among these, in consideration of heat dissipation, Cu, Al, or alloys of Cu and Al are particularly preferable.

In the metal base circuit board according to the present mode of embodiment, it is preferable for the thickness of the metal foil 1 to be 150 μm or more, and 300 μm or less.

If the thickness of the metal foil 1 is greater than 150 μm, then problems such as breakage in handling during the manufacture of the metal base circuit board can be suppressed, and from the standpoint of having thinner liquid crystal display devices, it is preferable for this to be 300 μm or less.

[Insulating Layer]

In the metal base circuit board according to the present mode of embodiment, the linear expansion coefficient of the insulating layer 2 is 60 ppm per degree C. or higher, and 120 ppm per degree C. or lower.

As materials that can be utilized as insulating layers, any insulating material can be selected appropriately as long as it has said linear expansion coefficients, and concrete examples are epoxy resin, silicone resin, and copolymers thereof.

Among these, for reasons having to do with heat resistance and adhesiveness to metals, epoxy resin is particularly preferable.

Additionally, these resins can contain, as appropriate, curing agents, inorganic fillers, and further additive agents that improve leveling ability and wettability to the underlying material, and promote a decrease in viscosity, in order to reduce the occurrence of defects during formation. Examples of such additive agents are antifoaming agents, surface adjusting agents, wetting and dispersing agents, or the like.

In the metal base circuit board according to the present mode of embodiment, it is preferable for the thickness of the insulating layer 2 to be 80 μm or more, and 180 μm or less.

If the thickness of the insulating layer 2 is 80 μm or more, then it is easy to secure insulating ability, and if it is 180 μm or less it is easy to form uniformly into an insulating layer.

As the epoxy resin used in the insulating layer 2, publicly known epoxy resins can be utilized, and examples that can be given are substances containing epoxy groups such as bisphenol A diglycidyl ether, bisphenol F diglycidyl ether, bisphenol S diglycidyl ether, resorcinol diglycidyl ether, hexahydro bisphenol A diglycidyl ether, polypropylene glycol diglycidyl ether, neopentyl glycol diglycidyl ether, phthalic acid diglycidyl ester, dimer acid diglycidyl ester, triglycidyl isocyanurate, tetraglycidyl diamino diphenyl methane, tetraglycidyl methaxylene diamine, phenol novolac polyglycidyl ether, tetrabrome bisphenol A diglycidyl ether, bisphenol hexafluoroacetone diglycidyl ether and the like.

Among these, for reasons having to do with heat resistance and adhesiveness to metals, bisphenol A diglycidyl ether and bisphenol F diglycidyl ether are particularly preferable.

It is preferable for the chloride ion concentration in the epoxy resin to be 1000 ppm or less, and more preferable for this to be 500 ppm or less.

If the chloride ion concentration within the epoxy resin composition is high, then under high temperatures, under high humidity, and under direct or alternating current, migration of ionic impurities occurs, and there is a tendency for the electrical insulation ability to decrease.

Among curing agents for the epoxy resin, ones which contain substances that have either one or both of a hydroxide group and an amino group that reacts with epoxy groups are desirable. Examples of curing agents for said epoxy resins are polyamine and polyphenol.

In cases where curing agents for epoxy resin, particularly substances containing hydroxyl groups are used, hardening accelerators may be used.

For the hardening accelerators, it is preferable that they be imidazole-based. For example, 2-methylimidazole, 2-undecylimidazole, 2-heptadecylimidazole, 1,2-dimethylimidazole, 2-methyl-4-methylimidazole, 2-phenylimidazole, 2-phenyl-4-methylimidazole, 1-benzyl-2-methylimidazole, 1-benzyl-2-phenylimidazole, 2,3-dihydro-1H-pyrolo[1,2-a]benzimidazole, 2-phenyl-4,5-dihydrosymethylimidazole, 2,4-diamino-6-[2'-methylimidazole-(1')]-ethyl-s-triazine, 2,4-diamino-6-[2'-undecylimidazole-(1')]-ethyl-s-triazine, 1-cyanomethyl-2-methylimidazole, and the like are desirable.

Among these, for the reasons of improvement of reliability against moisture and Tg (glass transition temperature), 2,3-dihydro-1H-pyrolo[1,2-a]benzimidazole is particularly preferable.

It is desirable for the amount of hardening accelerator to be added to be 0.005 parts or more, and 5 parts or less.

If the amount of hardening accelerator added is 5 parts or less, the pot life becomes longer, and a decrease in workability due to thickening can be suppressed, and if it is 0.005 parts or greater, then the high temperature heating during hardening becomes shorter, and this is preferable from the standpoint of cost and workability.

As inorganic fillers to be contained in the insulating layer 2, fillers that are electrically insulating and have an excellent thermal conductivity are preferable, for example, silica, alumina, aluminum nitride, silicon nitride, boron nitride, and magnesium oxide. Among these, from the standpoint of electrical insulation and thermal conductivity, silica, alumina, and aluminum nitride are particularly preferable.

It is preferable for the sodium ion concentration within the inorganic filler to be 500 ppm or less, and more preferable for this to be 100 ppm or less.

If the sodium ion concentration in the inorganic filler is 500 ppm or less, then it is difficult for ionic impurities to migrate under high temperatures, under high humidity, or under direct or alternating current, and a decrease in electrical conductivity can be suppressed.

With regard to the amount of inorganic filler to be contained in the insulating layer 2, it is desirable for the inorganic filler to make up 40 percent by volume or more, and 70 percent by volume or less of the total volume of the insulating layer.

If the amount of inorganic filler contained is 40 percent by volume or more, a sufficient thermal conductivity can be obtained, and if it is 70 percent by volume or less, then it becomes difficult for defects to arise during the formation of the insulating layer 2, and voltage resistance and adhesiveness will not be lost.

Additionally, it is further desirable to mix together two or more types of inorganic filler having different particle diameters, in order to avoid thickening due to the inorganic filler.

It is preferable for the thermal conductivity of the insulating layer 2 after curing to be 1 W/m·K or greater, and more preferable for this to be 2 W/m·K or greater.

If the thermal conductivity after curing is 1 W/m·K or greater, then heat arising from the electrical parts can efficiently be released to the reverse surface of the metal base circuit board, and further, by releasing this heat to the outside, the buildup of heat due to electric parts can be reduced, and the rise of temperature of the electrical parts can be made small, and in addition, a hybrid integrated circuit module having a long lifespan can be provided.

Further, in order to secure the insulating property when a voltage is applied to the circuit portions after the mounting of electric parts such as LEDs, it is preferable for the breakdown voltage of the insulating layer 2 to be 1.8 kV or higher, and even more preferable for this to be 2 kV or higher.

In the metal base circuit board according to the present mode of embodiment, it is preferable for the relationship between the linear expansion coefficient of the metal material comprising the metal foil, the linear expansion coefficient of the insulating layer, and the linear expansion coefficient of the circuit portion and the non-circuit portion to be:

linear expansion coefficient of insulating layer>linear expansion coefficient of metal foil>linear expansion coefficient of circuit portion and non-circuit portion.

The reason the linear expansion coefficient of the metal material comprising the metal foil is greater than the linear expansion coefficient of the circuit portion and the non-circuit portion is in order to reduce the linear expansion coefficient of the circuit portion for which it is desired that warping should not occur, and thereby to suppress warping during the formation of the circuit portion and the non-circuit portion on the insulating layer, and to maintain an excellent workability during circuit formation and LED mounting.

It is desirable for the face of the insulating layer 2 whereon the non-circuit portion 4 and the circuit portion 3 are mounted to be flat and have excellent light reflectivity. Particularly, it is desirable for the surface on the insulating layer 2 on which the non-circuit portion 4 and the circuit portion 3 adheres to undergo surface roughening treatment, plating, silane coupling treatment, and the like, in order to increase adhesion.

It is preferable for the 90 degree C. peel strength between the insulating layer 2 and the "circuit portion 3 and the non-circuit portion 4" to be 1 kg/cm or greater, and more preferable for this to be 1.4 kg/cm or greater, in order to secure connection reliability after the mounting of electric parts such as LEDs.

[White Film]

With regard to the resin to be used for the white film 5, it is preferable for this to contain at least one type of thermosetting resin or photo-curing resin. As the thermosetting resin, epoxy resin is preferable, and as the photo-curing resin, acryl resin is preferable.

With regard to the resin to be used for the white film 5, it is preferable for this to contain at least one type of white pigment, such as titanium dioxide, barium sulfate, talc, or silica.

In particular, white films that contain titanium dioxide have a high index of refraction, and the light reflectance of the circuit board will therefore be high, so they are preferable.

In addition, with regard to titanium dioxide, the rutile type is highly stable, so its photocatalytic action is weak, and the degradation of the resin component is therefore suppressed relative to titanium dioxide with other structures, so it is preferable. Additionally, in order to suppress photocatalytic action, it is preferable for the surface to be coated with aluminum hydroxide or silicon dioxide.

It is preferable for the amount of white pigment contained to be 30 percent by weight or more and 75 percent by weight or less of the composition of the white film 5.

If the amount of white pigment contained is 30 percent by weight or more, a sufficient reflectance can be obtained, and if it is 75 percent by weight or less, then the leveling ability is not reduced due to thickening, so a flat coating film can be obtained, and a reduction in reflectance can thereby be suppressed.

From the standpoint of effective utilization of the light emitted by the LED, it is preferable for the white film 5 to have a reflectance of 70 percent or more in the visible light range of 400 to 800 nm, and for it to have a reflectance of 70 percent or more at 460 nm (blue), 525 nm (red), and 620 nm (red) in more preferred embodiments.

In addition, it is desirable for the thermal conductivity of the white film 5 to be lower than the thermal conductivity of the insulating layer 2.

If the thermal conductivity of the white film 5 is lower than the thermal conductivity of the insulating layer 2, since the heat from the LED package is not released from the white film via the circuit portion, it is difficult for the ambient air temperature in the vicinity of the LED to rise, and the life span of the LED becomes longer.

Additionally, with regard to the metal base circuit board, it is preferable for this to have a total thickness of 265 µm or more, and 500 µm or less, in order to maintain mechanical strength.

Additionally, it is preferable for the metal base circuit board to have a warpage of 3 mm or less for each 100 mm of length of the metal base circuit board.

For the purpose of the present invention, the warpage is defined so that when the non-circuit portion 4 and the circuit portion 3 are on top of the insulating layer 2, if when laid on a flat and horizontal surface, it becomes concave facing upwards, it is defined as "+: plus", and if it becomes convex, facing downwards, it is defined as "−: minus". The absolute value of the warpage is the maximum height of the outer perimeter of the metal base circuit board relative to a flat and horizontal surface.

It is desirable for the outer shape of the metal base circuit board of the present invention to be up-down and left-right symmetric, and further desirable for it to be a square or a rectangle. Additionally, in cases where it is difficult to make the outer shape up-down and left-right symmetric, it is desirable to process the outer perimeter of the circuit board by making notches and the like.

The metal base circuit board of the present invention can extend the life span of LEDs because it has an excellent heat dissipating characteristic without using accessory members or thermal vias, and by suppressing warpage, the workability can be improved during circuit formation of the printed circuit board and LED mounting, and it is extremely industrially useful as a metal base circuit board for LED backlights.

The preferred modes of embodiment of the present invention have been described above, but these are mere examples of the present invention, and various other constitutions other than those given above may be utilized.

Embodiment Examples

Herebelow, embodiment examples according to the present invention, and comparative examples, shall be explained using drawings and table 1, but the present invention is not limited to these.

The metal base circuit board according to the present embodiment example is a metal base circuit board having a metal foil 1, an insulating layer 2 formed on one surface of the metal foil 1, a circuit portion 3 and a non-circuit portion 4 formed on the surface of the insulating layer 2 whereon the metal foil 1 is not provided, and a white film 5 formed on top of the insulating layer 2 and the circuit portion 3 and the non-circuit portion 4, as shown in FIG. 1. Reference number 7 in the drawing is an LED package.

Embodiment Examples

The metal base circuit board of embodiment example 1 was made according to the following method.

An insulating layer 2 was formed on a copper foil having a thickness of 35 µm, in such a way that the thickness after curing is 150 µm.

The insulating layer 2 was blended by adding, to a bisphenol A type epoxy resin ("EPICLON-828", manufactured by Dainippon Ink and Chemicals), diaminodiphenylmethane ("H84B", manufactured by Nihon Gosei Kako) as an amine-based curing agent, and then adding silicon oxide in the form of fragmented coarse particles having an average particle size of 1.2 µm ("A-1", manufactured by Tatsumori) and silicon oxide in the form of fragmented coarse particles having an average particle size of 10 µm ("SQ-10", manufactured by Hayashi Kasei) so as to form 35 percent by volume of the insulating layer (the mass ratio of spherical coarse particles and spherical fine particles being 6:4).

Next, aluminum foil of thickness 200 µm was stuck on, and the insulating layer 2 was heat cured by heating, and a metal base board wherein the sodium ion concentration in the entirety of the inorganic filler in the insulating layer 2 is 50 ppm or less was obtained.

Further, regarding the obtained metal base board, after masking predetermined locations with etching resists and etching the copper foil so that the circuit portion and the non-circuit portion have various total areas, the etching resist was removed and a copper circuit potion 3 and non-circuit portion 4 were formed, and thereby a metal base circuit board was obtained.

Further, a white solder resist was applied on the metal base circuit board as a white film 5 having a high reflectance, and this was cured by heating and ultraviolet light.

At this time, a white film coating was not formed on the LED package mounting portion on the circuit portion 3. As the white solder resist, "SSR-63005", manufactured by San-ei Kagaku was used.

For the embodiment example 1, as shown in table 1, the total area of the non-circuit portion 4 and the circuit portion 3 on top of the insulating layer 2 was made to be 79% of the area of the metal foil 1, and the linear expansion coefficient of the metal material constituting the metal foil 1 was made to be 23.9 ppm per degree C., the linear expansion coefficient of the insulating layer 2 was made to be 91.3 ppm per degree C., and the linear expansion coefficient of the circuit portion 3 and the non-circuit portion 4 was made to be 17.5 ppm per degree C.

The contained amount of inorganic filler relative to the total volume of the insulating layer 2 was 35%, the resin used for the insulating layer was made to be epoxy resin, and further, an amine-based curing agent was added to the insulating layer.

As shown in FIG. 1, in embodiment example 1, the warping amount was 1.7 mm, an excellent value, less than 3 mm.

TABLE 1

|  | Embodiment Examples | | | Comparative Examples | |
| --- | --- | --- | --- | --- | --- |
|  | 1 | 2 | 3 | 1 | 2 |
| (Area of Circuit Portion + Area of Non-Circuit Portion)/Area of Metal Foil (Units: %) | 79 | 79 | 79 | 98 | 30 |
| Linear Expansion Coefficient A of Insulating Layer (Units: ppm/deg C.) | 23.9 | 23.9 | 23.9 | 23.9 | 23.9 |
| Linear Expansion Coefficient B of Insulating Layer (Units: ppm/deg C.) | 91.3 | 91.3 | 91.3 | 91.3 | 91.3 |
| Linear Expansion Coefficient C of Circuit Potion and Non-Circuit Portion (Units: ppm/deg C.) | 17.5 | 17.5 | 17.5 | 17.5 | 17.5 |
| Contained Amount of Inorganic Filler Relative to Total Area of Insulating Layer (Units: %) | 35 | 56 | 35 | 35 | 35 |
| Resin Used for Insulating Layer | Epoxy Resin | Epoxy Resin | Epoxy Resin | Epoxy Resin | Epoxy Resin |
| Curing Agent, Catalyst Used for Insulating Layer | Amine Based Curing Agent | Amine Based Curing Agent | Phenol Novolac, Imidazole Based Curing Catalyst | Amine Based Curing Agent | Amine Based Curing Agent |
| Warpage Amount (Unit: mm) | 1.2 | 1.1 | 1.8 | Circuit Formation Impossible | 11.4 |
| Circuit Board Temperature during LED Operation | 63 | 58 | 65 | Unmeasurable | 125 |

|  | Comparative Examples | | | |
| --- | --- | --- | --- | --- |
|  | 3 | 4 | 5 | 6 |
| (Area of Circuit Portion + Area of Non-Circuit Portion)/Area of Metal Foil (Units: %) | 79 | 79 | 79 | 79 |
| Linear Expansion Coefficient A of Insulating Layer (Units: ppm/deg C.) | 39.7 | 23.9 | 23.9 | 10.5 |
| Linear Expansion Coefficient B of Insulating Layer (Units: ppm/deg C.) | 91.3 | 127.5 | 91.3 | 91.3 |
| Linear Expansion Coefficient C of Circuit Potion and Non-Circuit Portion (Units: ppm/deg C.) | 17.5 | 17.5 | 4.3 | 23.9 |
| Contained Amount of Inorganic Filler Relative to Total Area of Insulating Layer (Units: %) | 35 | 0 | 35 | 35 |
| Resin Used for Insulating Layer | Epoxy Resin | Epoxy Resin | Epoxy Resin | Epoxy Resin |
| Curing Agent, Catalyst Used for Insulating Layer | Phenol Novolac | Amine Based Curing Agent | Amine Based Curing Agent, Phenol Novolac, Imidazole Based Curing Catalyst | Amine Based Curing Agent, Phenol Novolac |
| Warpage Amount (Unit: mm) | 4.9 | 7.3 | 6.7 | 9.2 |
| Circuit Board Temperature during LED Operation | 88 | 102 | 98 | 112 |

As shown in table 1, embodiment example 2 was made in a similar manner to embodiment example 1, with the exception that the contained amount of inorganic filler relative to the total volume of the insulating layer 2 was made to be 56%.

In embodiment 2, the warpage amount was 1.1 mm, less than 3 mm and so excellent.

As shown in table 1, embodiment example 3 was made in a similar manner to embodiment example 1, with the exception that the curing agent used for the insulating layer 2 was made to be phenol novolac ("HF-4M", manufactured by Meiwa Plastic Industries), and a imidazole based curing catalyst ("2,3-dihydro-1H-pyrolo[1,2-a]benzimidazole", manufactured by Shikoku Chemicals) was used as a catalyst.

In embodiment example 3, the warpage amount was 1.8 mm, less than 3 mm and so excellent.

Comparative Examples

As shown in table 1, comparative example 1 was made in a similar manner to embodiment example 1, with the exception that the total sum of the areas of the non-circuit portion 4 and the circuit portion 3 on the insulating layer 2 was 98% of the area of the metal foil 1.

In comparative example 1, not only could the warpage amount not be measured, circuit formation was impossible.

As shown in table 1, comparative example 2 was made in a similar manner to embodiment example 1, with the exception that the total sum of the areas of the non-circuit portion 4 and the circuit portion 3 on the insulating layer 2 was 30% of the area of the metal foil 1.

In comparative example 2, the warpage amount was 11.4 mm, so a very large warpage was created.

As shown in table 1, comparative example 3 was made in a similar manner to embodiment example 1, with the exception that the linear expansion coefficient of the metal foil was 39.7 ppm per degree C., and for the curing agent used for insulating layer 2, phenol novolac was used ("HF-4M", manufactured by Meiwa Plastic Industries).

In comparative example 3, the warpage amount was 4.9 mm, so it was larger than 3 mm.

As shown in table 1, comparative example 4 was made in a similar manner to embodiment example 1, with the exception that the linear expansion coefficient of insulating layer 2 was 127.5 ppm per degree C., and the percent by volume of the inorganic filler was 0.

In comparative example 4, the warpage amount was 7.3 mm, so it was larger than 3 mm.

As shown in table 1, comparative example 5 was made in a similar manner to embodiment example 1, with the exception that the linear expansion coefficient of the circuit portion and the non-circuit portion was 4.3 ppm per degree C., and for the curing agent used in the insulating layer 2, phenol novolac ("HF-4M", manufactured by Meiwa Plastic Industries) and an imidazole based curing catalyst ("2,3-dihydro-1H-pyrolo[1,2-a]benzimidazole", manufactured by Shikoku Chemicals) was used.

In comparative example 5, the warpage amount was 6.7 mm, so it was larger than 3 mm.

As shown in table 1, comparative example 6 was made in a similar manner to embodiment example 1, with the exception that the linear expansion coefficient of the metal foil was 10.5 ppm per degree C., and the linear expansion coefficient of the circuit portion and the non-circuit portion was made to be 23.9 ppm per degree C. so the linear expansion coefficient of the circuit portion and the non-circuit portion was higher than the linear expansion coefficient of the metal foil, and the curing agent used for the insulating layer 2 was made to be an amine based curing agent and phenol novolac ("HF-4M", manufactured by Meiwa Plastic Industries).

In comparative example 6, the warpage amount was 9.2 mm, so it was larger than 3 mm.

As described above, the metal base circuit board according to the present invention can suppress the amount of warpage of the board to half or less, relative to comparative examples. For this reason, workability during circuit formation on a printed circuit board and LED mounting can be improved.

The invention claimed is:

1. A metal base circuit board, having
   an insulating layer with a linear expansion coefficient of 60 ppm per degree C. or higher and 120 ppm per degree C. or lower,
   a metal foil provided on one side of the insulating layer, comprising a metal material with a linear expansion coefficient of 10 ppm per degree C. or higher and 35 ppm per degree C. or lower,
   a circuit portion and a non-circuit potion having a linear expansion coefficient of 10 ppm per degree C. or higher and 35 ppm per degree C. or lower,
   and a white film formed on top of the insulating layer, circuit portion, and non-circuit portion,
   the total sum of the areas of the non-circuit portion and the circuit portion on top of the insulating layer being 50% or higher and 95% or lower relative to the area of the metal foil, and the relation between the linear expansion coefficients of each of the materials being: linear expansion coefficient of insulating layer>linear expansion coefficient of metal foil>linear expansion coefficient of circuit portion and non-circuit portion.

2. A metal base circuit board according to claim 1, wherein said insulating layer is formed with epoxy resin, a curing agent, and an inorganic filler, and the inorganic filler makes up 40 percent by volume or more, and 70 percent by volume or less, of the total volume of the insulating layer.

3. A metal base circuit board according to claim 1, wherein said curing agent contains a substance that has either one or both of a hydroxyl group and an amino group.

4. A metal base circuit board according to claim 1, wherein said white film contains titanium dioxide as a white pigment, the titanium dioxide being rutile type and the surface being coated with aluminum hydroxide or silicon dioxide.

\* \* \* \* \*